United States Patent
Hamzeh et al.

(10) Patent No.: US 11,811,531 B1
(45) Date of Patent: *Nov. 7, 2023

(54) DOWNLINK POWER CONTROL FOR INTERFERENCE MITIGATION IN COMPETING COMMUNICATION SYSTEMS

(71) Applicant: CABLE TELEVISION LABORATORIES, INC., Louisville, CO (US)

(72) Inventors: Belal Hamzeh, Westminster, CO (US); Jennifer Andreoli-Fang, Boulder, CO (US); Alireza Babaei, Herndon, VA (US); Luis Alberto Campos, Superior, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 239 days.

This patent is subject to a terminal disclaimer.

(21) Appl. No.: 17/083,197

(22) Filed: Oct. 28, 2020

Related U.S. Application Data

(63) Continuation of application No. 16/047,335, filed on Jul. 27, 2018, now Pat. No. 10,924,214, which is a
(Continued)

(51) Int. Cl.
*H04L 1/00* (2006.01)
*H04L 27/00* (2006.01)
(Continued)

(52) U.S. Cl.
CPC .......... *H04L 1/007* (2013.01); *H03M 13/353* (2013.01); *H04J 3/0647* (2013.01); *H04J 3/1694* (2013.01);
(Continued)

(58) Field of Classification Search
CPC ............ H04W 16/14; H04W 72/1215; H04W 72/082; H04W 72/042; H04W 24/10;
(Continued)

(56) References Cited

U.S. PATENT DOCUMENTS 5,517,522 A    5/1996 Arweiler et al.
5,828,677 A    10/1998 Sayeed et al.
(Continued)

OTHER PUBLICATIONS

Hu et al. "Interference avoidance for in-device coexistence in 3GPP LTE-advanced: challenges and solutions," IEEE, pp. 60-67, 2012.

*Primary Examiner* — Scott M Sciacca
*Assistant Examiner* — Mon Cheri S Davenport
(74) *Attorney, Agent, or Firm* — PdZ Patent Law, PLLC

(57) ABSTRACT

Systems and methods presented herein provide for altering communications of a LTE wireless communication system operating in an RF band with a conflicting WiFi system. In one embodiment, an LTE system includes a wireless base station operable to transmit downlink communications to a UE in the RF band and to receive uplink communications from the UE in the RF band. The LTE system also includes a processor operable to detect the uplink communications from the UE, to estimate a location of the UE based on the detected uplink communications, to determine a communication capability between the UE and the wireless base station based on the location of the UE, and to downgrade the downlink communications from the wireless base station to the UE based on the determined communication capability to avoid interference with the WiFi communication system.

20 Claims, 6 Drawing Sheets

Related U.S. Application Data continuation of application No. 14/510,881, filed on Oct. 9, 2014, now abandoned.

(60) Provisional application No. 62/030,443, filed on Jul. 29, 2014.

(51) Int. Cl.

| | |
|---|---|
| *H04J 3/06* | (2006.01) |
| *H04J 3/16* | (2006.01) |
| *H04L 5/00* | (2006.01) |
| *H04W 72/0446* | (2023.01) |
| *H03M 13/35* | (2006.01) |
| *H04W 72/20* | (2023.01) |
| *H04W 72/541* | (2023.01) |
| *H04W 76/10* | (2018.01) |
| *H04W 84/12* | (2009.01) |

(52) U.S. Cl.
CPC .......... *H04L 1/0009* (2013.01); *H04L 1/0011* (2013.01); *H04L 1/0041* (2013.01); *H04L 1/0045* (2013.01); *H04L 5/0092* (2013.01); *H04L 27/0006* (2013.01); *H04W 72/0446* (2013.01); *H04W 72/20* (2023.01); *H04W 72/541* (2023.01); *H04W 76/10* (2018.02); *H04W 84/12* (2013.01)

(58) Field of Classification Search
CPC ......... H04W 72/0453; H04W 72/0406; H04W 16/18; H04W 28/048; H04W 84/12; H04L 43/50; H04L 5/0073; H04B 1/109
See application file for complete search history.

(56) References Cited

U.S. PATENT DOCUMENTS

| | | | |
|---|---|---|---|
| 6,731,694 B2 | 5/2004 | Bozeki et al. | |
| 6,754,506 B2 | 6/2004 | Chang et al. | |
| 6,977,888 B1 | 12/2005 | Frenger et al. | |
| 7,907,512 B1 | 3/2011 | Embse | |
| 8,260,328 B1 | 9/2012 | Yellin et al. | |
| 8,423,033 B1 | 4/2013 | Everson et al. | |
| 8,908,605 B1 | 12/2014 | Oroskar | |
| 9,479,940 B2 | 10/2016 | Padden et al. | |
| 9,559,728 B2 | 1/2017 | Babaei et al. | |
| 9,730,196 B2 | 8/2017 | Hamzeh et al. | |
| 10,091,769 B2 | 10/2018 | Campos et al. | |
| 10,122,494 B2 | 11/2018 | Babaei et al. | |
| 10,924,214 B2 * | 2/2021 | Hamzeh ............. | H04W 72/082 |
| 11,109,238 B2 | 8/2021 | Campos et al. | |
| 2001/0012280 A1 | 8/2001 | Dent | |
| 2003/0135794 A1 | 7/2003 | Longwell et al. | |
| 2005/0036727 A1 | 2/2005 | Wijngaarden et al. | |
| 2006/0112237 A1 | 5/2006 | Chen et al. | |
| 2006/0239230 A1 | 10/2006 | Nakano | |
| 2007/0072645 A1 | 3/2007 | Clark et al. | |
| 2007/0237117 A1 | 10/2007 | Moon et al. | |
| 2007/0263587 A1 | 11/2007 | Savoor et al. | |
| 2008/0102880 A1 | 5/2008 | Gholmieh et al. | |
| 2008/0119195 A1 | 5/2008 | Hansson et al. | |
| 2008/0187059 A1 | 8/2008 | Sood | |
| 2008/0219213 A1 | 9/2008 | Natarajan et al. | |
| 2008/0298238 A1 | 12/2008 | Dawson et al. | |
| 2008/0317162 A1 | 12/2008 | Roh et al. | |
| 2009/0059856 A1 | 3/2009 | Kermoal et al. | |
| 2009/0238090 A1 | 9/2009 | Sambhwani et al. | |
| 2009/0268692 A1 | 10/2009 | Haartsen et al. | |
| 2010/0069080 A1 | 3/2010 | Benveniste | |
| 2010/0178919 A1 | 7/2010 | Deepak et al. | |
| 2010/0210214 A1 | 8/2010 | Pawar et al. | |
| 2010/0220676 A1 | 9/2010 | Grandblaise et al. | |
| 2010/0248768 A1 | 9/2010 | Nakatsugawa | |
| 2010/0271263 A1 | 10/2010 | Moslifeghi | |
| 2010/0304779 A1 | 12/2010 | Andrews et al. | |
| 2010/0329118 A1 | 12/2010 | Adams | |
| 2011/0103343 A1 | 5/2011 | Nishio et al. | |
| 2011/0150505 A1 | 6/2011 | Roberts et al. | |
| 2011/0246862 A1 | 10/2011 | Graef | |
| 2011/0255514 A1 | 10/2011 | Olofsson et al. | |
| 2011/0286433 A1 | 11/2011 | Xiao et al. | |
| 2012/0033645 A1 | 2/2012 | Mantravadi et al. | |
| 2012/0058742 A1 | 3/2012 | Razoumov et al. | |
| 2012/0159220 A1 | 6/2012 | Winkler et al. | |
| 2012/0164948 A1 | 6/2012 | Narasimha et al. | |
| 2012/0178483 A1 | 7/2012 | Rosenau | |
| 2012/0213116 A1 | 8/2012 | Koo et al. | |
| 2012/0238301 A1 | 9/2012 | Morrison | |
| 2013/0028201 A1 | 1/2013 | Koo et al. | |
| 2013/0028223 A1 | 1/2013 | Kim et al. | |
| 2013/0083743 A1 | 4/2013 | Koo et al. | |
| 2013/0090124 A1 | 4/2013 | Panchai et al. | |
| 2013/0095760 A1 | 4/2013 | Thota et al. | |
| 2013/0138826 A1 | 5/2013 | Ling et al. | |
| 2013/0148638 A1 | 6/2013 | Xing et al. | |
| 2013/0176953 A1 | 7/2013 | Stern-Berkowitz et al. | |
| 2013/0178219 A1 | 7/2013 | Lee et al. | |
| 2013/0201864 A1 | 8/2013 | Acharya et al. | |
| 2013/0208587 A1 | 8/2013 | Bala et al. | |
| 2013/0210447 A1 | 8/2013 | Moe et al. | |
| 2013/0242907 A1 | 9/2013 | Kang et al. | |
| 2013/0265916 A1 | 10/2013 | Zhu et al. | |
| 2013/0272260 A1 * | 10/2013 | Bitran ................... | H04W 76/15 370/329 |
| 2013/0273857 A1 | 10/2013 | Zhang et al. | |
| 2013/0322367 A1 | 12/2013 | Kang et al. | |
| 2014/0003239 A1 | 1/2014 | Etemad et al. | |
| 2014/0029490 A1 | 1/2014 | Kim et al. | |
| 2014/0038657 A1 | 2/2014 | Jo et al. | |
| 2014/0045491 A1 | 2/2014 | Phan et al. | |
| 2014/0050086 A1 | 2/2014 | Himayat et al. | |
| 2014/0050206 A1 | 2/2014 | Seo et al. | |
| 2014/0056204 A1 | 2/2014 | Suh et al. | |
| 2014/0057610 A1 | 2/2014 | Olincy et al. | |
| 2014/0080534 A1 | 3/2014 | Farhadi et al. | |
| 2014/0086175 A1 | 3/2014 | Hakola et al. | |
| 2014/0092765 A1 | 4/2014 | Agarwal et al. | |
| 2014/0098734 A1 | 4/2014 | Kalhan et al. | |
| 2014/0115279 A1 | 4/2014 | Chirca et al. | |
| 2014/0128088 A1 | 5/2014 | Farhadi | |
| 2014/0148165 A1 | 5/2014 | Serravalle et al. | |
| 2014/0161021 A1 | 6/2014 | Goldhamer | |
| 2014/0162659 A1 | 6/2014 | Aminaka et al. | |
| 2014/0169368 A1 | 6/2014 | Grover et al. | |
| 2014/0269368 A1 | 9/2014 | Xu et al. | |
| 2014/0269484 A1 | 9/2014 | Dankberg et al. | |
| 2014/0349704 A1 | 11/2014 | Xiao et al. | |
| 2014/0362750 A1 | 12/2014 | Song et al. | |
| 2014/0362840 A1 | 12/2014 | Wong et al. | |
| 2014/0376483 A1 | 12/2014 | Hong et al. | |
| 2015/0003469 A1 | 1/2015 | Martinez | |
| 2015/0016441 A1 | 1/2015 | Hanson et al. | |
| 2015/0017999 A1 | 1/2015 | Chen et al. | |
| 2015/0023184 A1 | 1/2015 | Dili et al. | |
| 2015/0085683 A1 | 3/2015 | Sadek et al. | |
| 2015/0146686 A1 | 5/2015 | Huang et al. | |
| 2015/0163767 A1 * | 6/2015 | Shaw ................... | H04W 64/00 455/456.1 |
| 2015/0163805 A1 | 6/2015 | Cattoni et al. | |
| 2015/0188681 A1 | 7/2015 | Li et al. | |
| 2015/0208263 A1 | 7/2015 | Behravan et al. | |
| 2015/0223069 A1 | 8/2015 | Solondz | |
| 2015/0245232 A1 | 8/2015 | Luo et al. | |
| 2015/0245365 A1 | 8/2015 | Isokangas et al. | |
| 2015/0264582 A1 | 9/2015 | Brighenti et al. | |
| 2015/0270925 A1 | 9/2015 | Lin et al. | |
| 2015/0271681 A1 | 9/2015 | Perez et al. | |
| 2015/0289293 A1 | 10/2015 | Zhang et al. | |
| 2015/0373672 A1 | 12/2015 | Forssell | |
| 2015/0382264 A1 | 12/2015 | Cho et al. | |
| 2016/0037536 A1 | 2/2016 | Hamzeh et al. | |
| 2016/0095046 A1 | 3/2016 | Tervonen et al. | |
| 2016/0135055 A1 | 5/2016 | Bhorkar et al. | |

(56) References Cited

U.S. PATENT DOCUMENTS

| | | |
|---|---|---|
| 2016/0173369 A1 | 6/2016 | Chiba et al. |
| 2016/0227578 A1 | 8/2016 | Lee et al. |
| 2016/0270118 A1 | 9/2016 | He et al. |
| 2016/0295633 A1 | 10/2016 | Baligh et al. |
| 2016/0302225 A1 | 10/2016 | Damnjanovic et al. |
| 2017/0374612 A1 | 12/2017 | Stojanovski et al. |
| 2018/0027444 A1 | 1/2018 | Maria |
| 2018/0337748 A1 | 11/2018 | Hamzeh et al. |
| 2019/0074927 A1 | 3/2019 | Babaei et al. |

\* cited by examiner

DOWNLINK POWER CONTROL FOR INTERFERENCE MITIGATION IN COMPETING COMMUNICATION SYSTEMS

CROSS REFERENCE TO RELATED APPLICATIONS

This patent application is a continuation of U.S. patent application Ser. No. 16/047,335, filed on Jul. 27, 2018, which is a continuation of U.S. patent application Ser. No. 14/510,881, filed on Oct. 9, 2014, which application claims priority to, and thus the benefit of an earlier filing date from, U.S. Provisional Patent Application Ser. No. 62/030,443, filed on Jul. 29, 2014. The entire contents of each of the above-mentioned applications are incorporated herein by reference.

BACKGROUND

Long Term Evolution (LTE) wireless communications presently operate in certain licensed bands of the Radio Frequency (RF) spectrum so as to avoid conflicts with other wireless communication systems. However, LTE can operate in virtually any portion of the RF spectrum, including certain unlicensed portions of the spectrum where WiFi communication systems operate. Due to the nature of its MAC and PHY layers, LTE poses challenges to coexistence with other radio access technologies, such as WiFi. For example, WiFi is designed to coexist with other technologies via channel sensing and random backoff. But, LTE downlink channels are designed to continuously operate at a predefined power level decided by the operator's coverage requirements, regardless of where user equipment (UE) being served is actually located. Any LTE system operating in the same band as a WiFi system would interfere with the WiFi system because the WiFi system would have little chance to sense a clear channel and deem it suitable for transmission.

SUMMARY

Systems and methods presented herein provide for altering communications of a LTE wireless communication system operating in an RF band with a conflicting WiFi system. In one embodiment, an LTE system includes a wireless base station operable to transmit downlink communications to a UE in the RF band and to receive uplink communications from the UE in the RF band. The LTE system also includes a processor operable to detect the uplink communications from the UE, to estimate a location of the UE based on the detected uplink communications, to determine a communication capability between the UE and the wireless base station based on the location of the UE, and to downgrade the downlink communications from the wireless base station to the UE based on the determined communication capability to avoid interference with the WiFi communication system.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
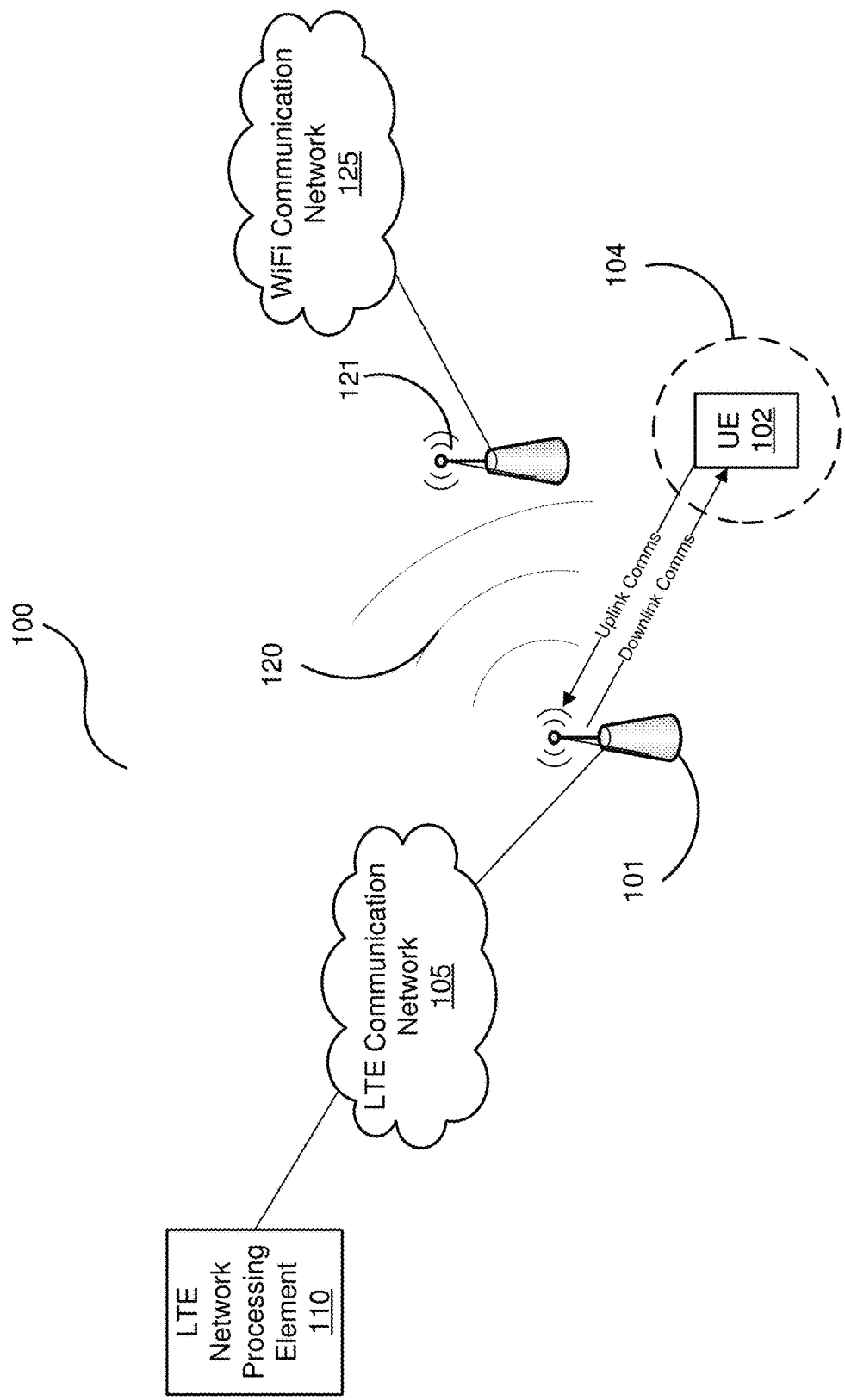
FIG. 1 is a block diagram of an exemplary LTE wireless telecommunication system operable to alter communication strategies to avoid interference with other communication systems.

FIG. 1 is a block diagram of an exemplary LTE wireless telecommunication system 100 operable to alter communication strategies to avoid interference with other communication systems, such as a WiFi communication system operating in the same RF band as the LTE system 100. Although shown with one base station 101 (i.e., for the sake of simplicity), the LTE system 100 typically comprises a plurality of base stations 101 that are operable to transmit to a plurality of subscriber UEs 102 through downlink communications and to receive uplink communications from the UEs 102. The uplink and downlink communications can be processed in a variety of ways as a matter design choice (e.g., at the base station 101, back office processing of a Mobile Communications Operator—"MCO", Virtual Radio Access Networks—"VRANs", etc.). Accordingly, the base station 101 may be implemented based on the type of uplink and downlink communication processing being employed (e.g., VRANs use base stations that are for the most part antennas and transceivers).

In whatever form, an LTE network processing element 110, being part of the LTE communication network 105, processes the uplink communications of the UE 102 and alters the communication strategy so as to avoid interfering (e.g., via antenna radiation pattern 120) with another communication system operating in the same RF band, such as the WiFi communication network 125 and its associated WiFi access point (WAP) 121. Thus, the LTE network processing element 110 is any system, device, software, or combination thereof operable to change downlink communications from the base station 101 to the UE 102 to avoid interfering with another wireless communication system operating in the same or a similar RF band. Examples of the UE 102 include cell phones, table computers, laptop computers, and the like. The LTE system 100 of FIG. 1 will now be shown and described with respect to one exemplary process in FIG. 2.

Figure 2:
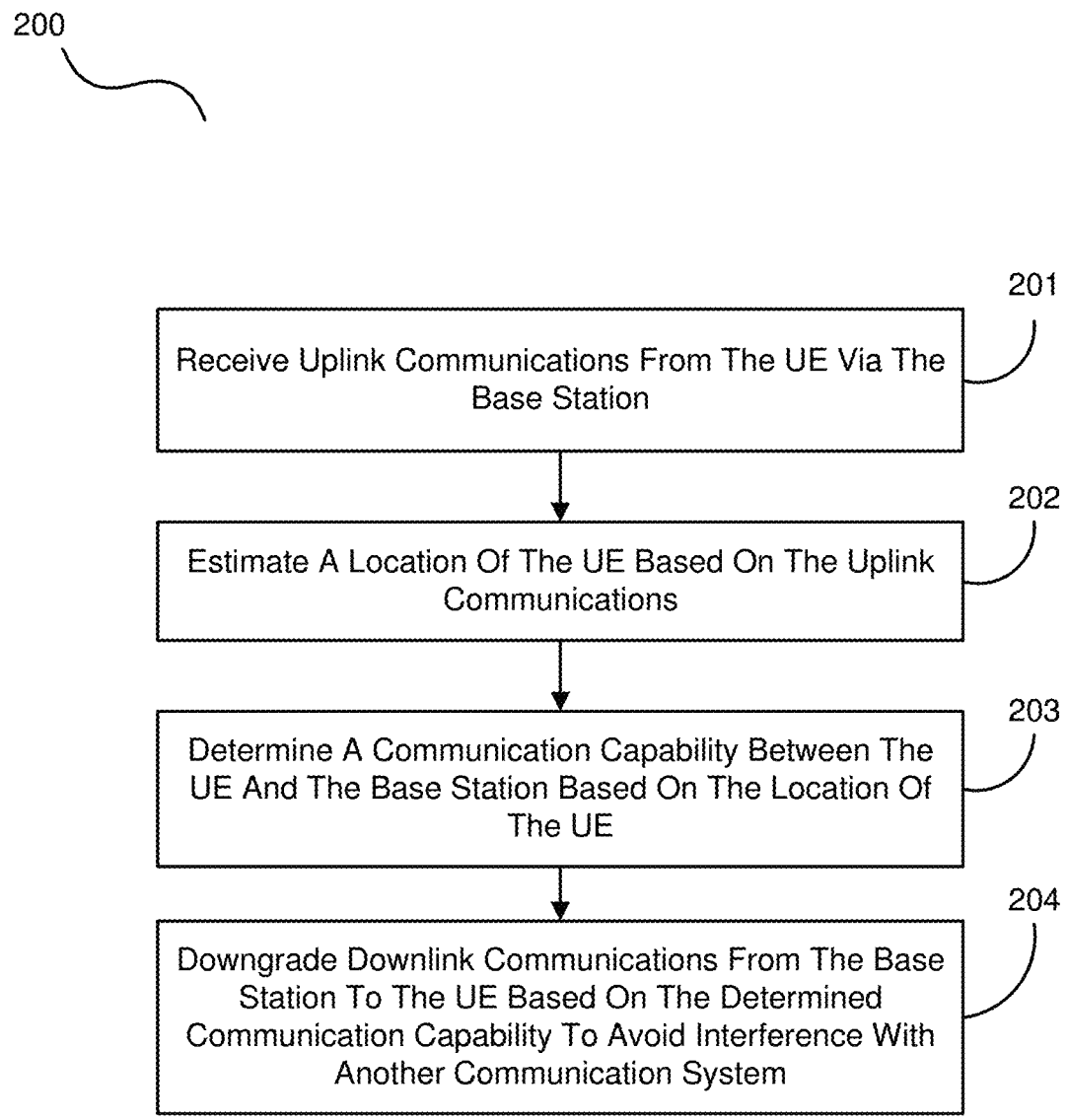
FIG. 2 is a flowchart illustrating an exemplary process of the LTE wireless telecommunication system.

FIG. 2 is a flowchart illustrating an exemplary process 200 of the LTE wireless telecommunication system 100 of FIG. 1. As mentioned, the base station 101 is operable to at least transmit downlink communications to the UE 102 in the same RF band as another wireless communication system such as the WiFi communication network 125. Accordingly, the base station 101 would likely interfere with the other wireless communication system because LTE downlink channels are designed to continuously operate at predefined power levels decided by the operator's coverage requirements.

In this embodiment, the base station 101 of the LTE system 100 receives uplink communications from the UE 102, in the process element 201. To avoid interference, the LTE network processing element 110 estimates a location of the UE 102 based on its uplink communications, in the process element 202. For example, along with data and/or voice being transmitted to the base station 101, the UE 102 may transmit other information that may be used in identifying a location of the UE 102. Examples of such information may include transmit signal strength of the UE 102, GPS information of the UE 102, or the like. Once the location of the UE 102 has been estimated, the network processing element 110 determines a communication capability between the UE 102 and the base station 101 based on the location of the UE 102, in the process element 203. For example, the network processing element 110 may assess the downlink data rate needs of the UE 102 to determine a communication scheme capable of delivering those needs. After the communication capability has been determined, the network processing element 102 then downgrades the downlink communications from the base station 101 to the UE 102 to avoid interference with another communication system, in the process element 204.

The manner in which the telecommunications are downgraded can be implemented in a variety of ways as a matter of design choice. For example, the LTE system 100 can adapt and jointly optimize its transmit power level, change the time/frequency resources allocated to its "attached" UEs, and/or change the Modulation and Coding Scheme (MCS) used to transmit information to its attached UEs in order to minimize the LTE signal energy footprint.

Generally though, the objective of this optimization is to reduce the transmit power level of the base station 101 such that the farthest UE 102 attached to the base station 101 receives the minimum signal energy that is needed to support its required data rate. As an example, it might be the case that a farthest UE 102 attached to the base station 101 needs only quadrature phase shift keyed (QPSK) modulation to achieve its required data rate even though the received signal energy is capable of supporting 64 quadrature amplitude modulation (QAM). And, an eNodeB base station in the LTE system 100 can operate at QPSK rather than at 64 QAM if the available resources allow, thereby lowering its transmit power by approximately 12 dB and dramatically reducing the interference observed by surrounding wireless systems, such as the WiFi communication network 125.

Figure 3:
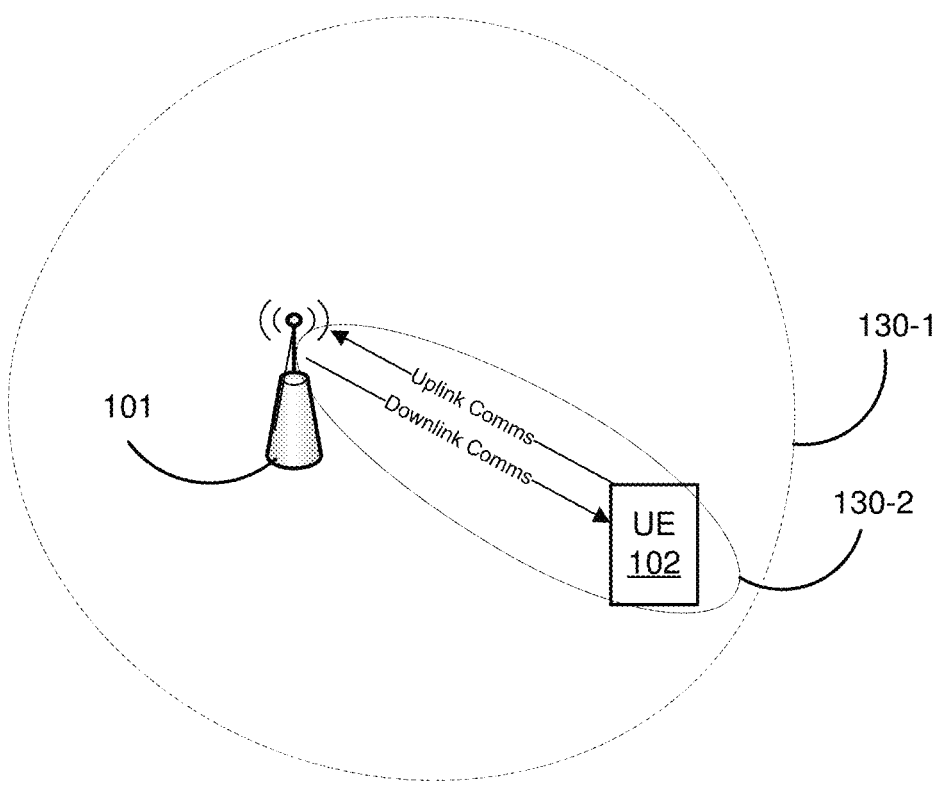
FIG. 3 is a block diagram of the LTE wireless telecommunications system altering its communications to avoid interference.

Another manner in which the communication capabilities of the LTE system 100 can be downgraded is illustrated in FIG. 3. FIG. 3 is a block diagram of the LTE system 100 altering its communications to avoid interference by changing its antenna radiation pattern. For example, the base station 101 may be configured with directional antennas as well as omnidirectional antennas, as illustrated by the antenna radiation patterns 130-2 and 130-1, respectively. In this simple example, the base station 101 may be configured to broadcast downlink communications via an omnidirectional antenna that radiates across a relatively large area as illustrated with the antenna radiation pattern 130-1. Yet, the network processing element 110 may determine that the base station 101 has only a single UE 102 attached, meaning that a large portion of the antenna radiation pattern 130-1 of the omnidirectional antenna is unused. Accordingly, the network processing element 110 may downgrade the communication capabilities of the base station 101 by switching to a more directional antenna that only radiates downlink communications in the direction of the UE 102, as illustrated by the antenna radiation pattern 130-2.

Of course, as with the embodiment illustrated in FIG. 3, information pertaining to the locations of the UEs 102 may be needed. Generally, the base station 101 can approximate the locations of the UEs 102 in a variety of ways as a matter design choice including, uplink power transmission levels, GPS coordinates, and/or information transferred to the base station 101.

Figure 4:
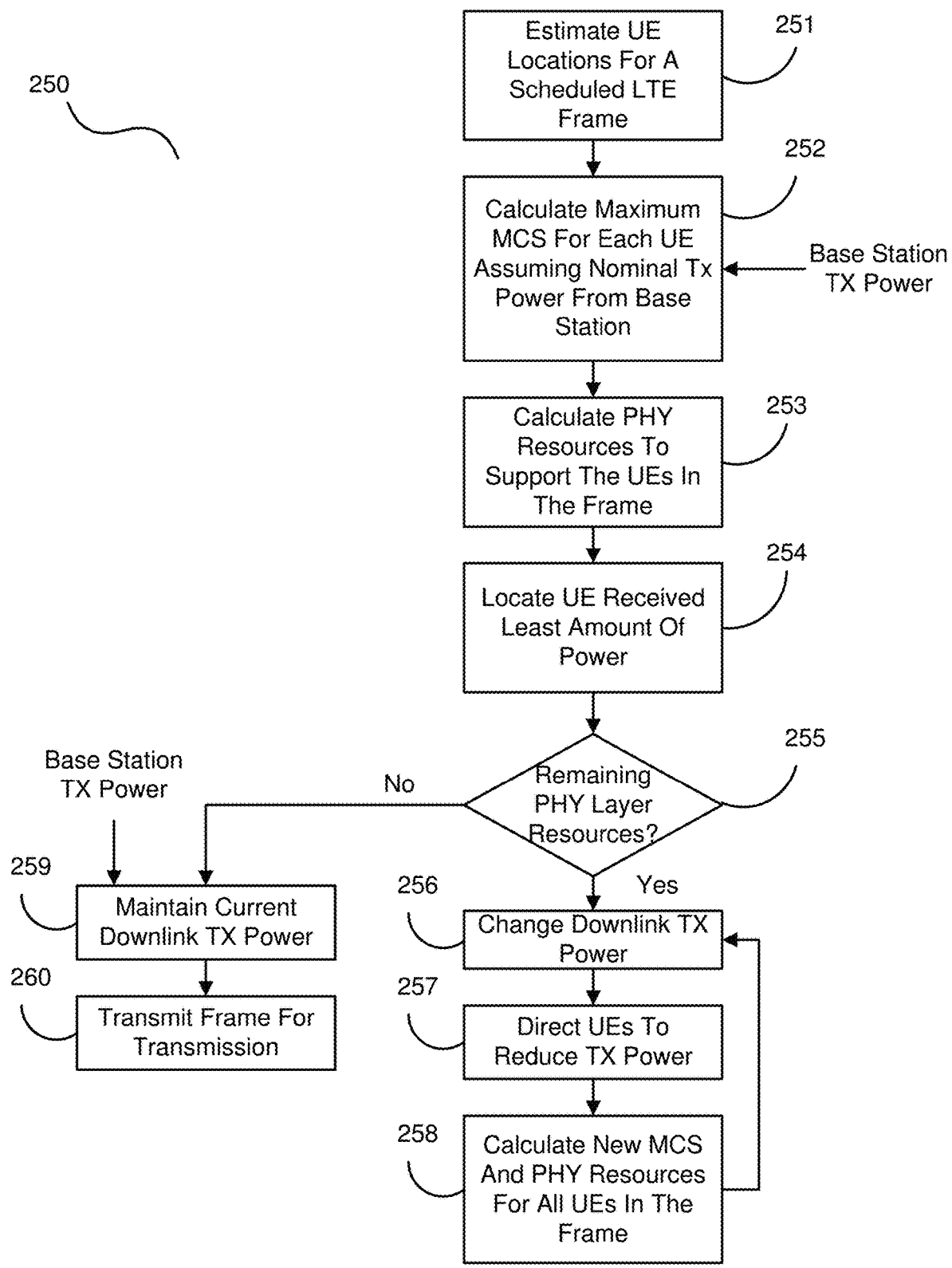
FIGS. 4 and 5 are flowcharts illustrating other exemplary processes of the LTE wireless telecommunications system.
Figure 5:
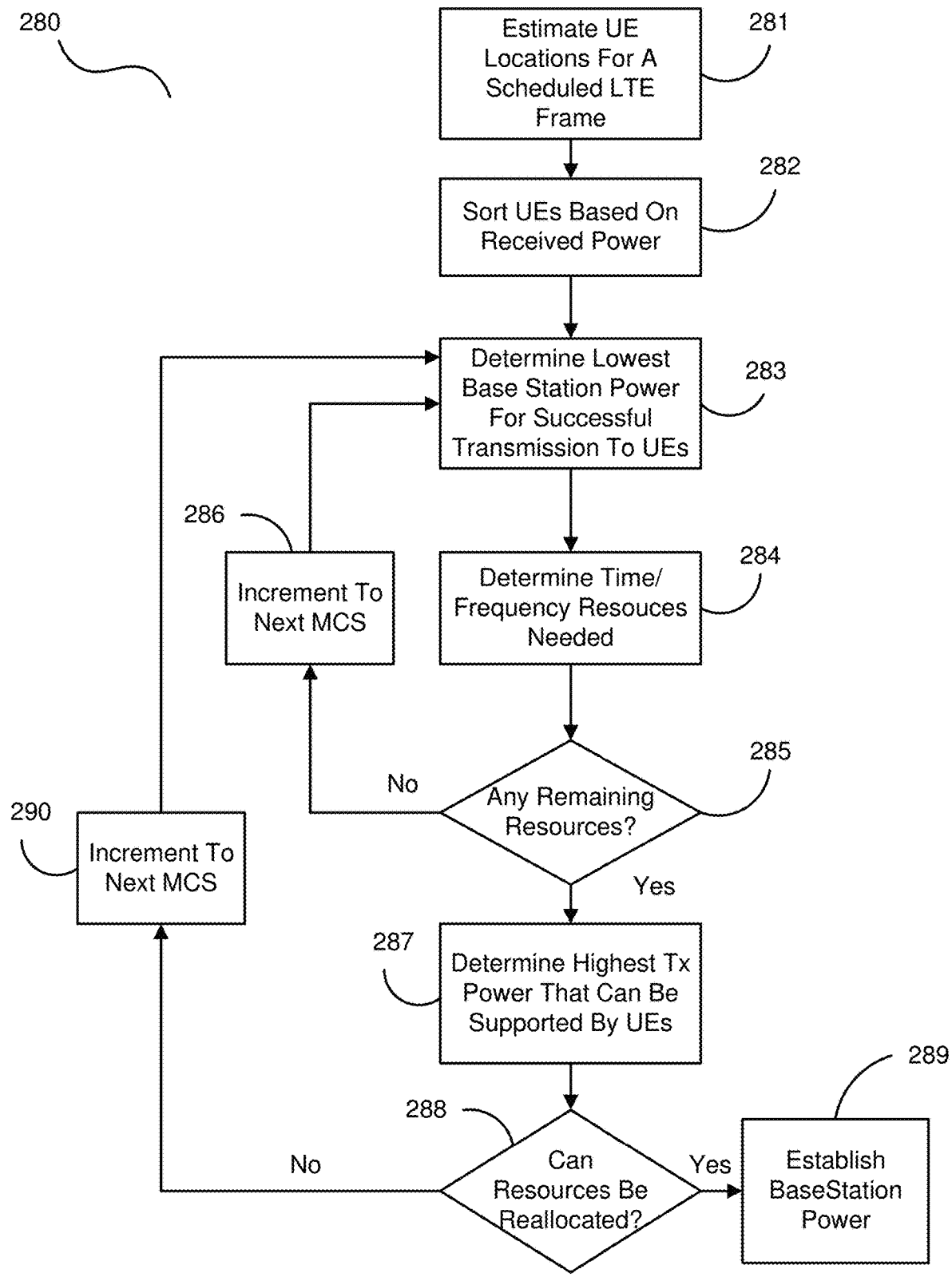

FIGS. 4 and 5 are flowcharts illustrating other exemplary processes of the LTE system 100 that control power of the downlink communications after the UEs 102 of a servicing base station 101 have been located. The process 250 of FIG. 4 represents one exemplary algorithm for achieving dynamic downlink power control in which the network processing element 110 iteratively locates all of the UEs 102 of a servicing base station 101 and then reduces the maximum required transmit power within the constraints of the available resources in the physical layer. In this regard, the process 250 initiates with the network processing element 110 estimating the locations of the UE 102 for a scheduled LTE frame, in the process element 251.

The network processing element 110 then calculates a maximum MCS for each UE 102 assuming a nominal transmit power from the base station 101, in the processing element 252. For example, the network processing element 110 determines whether a particular UE 102 is receiving a minimum power within the constraints of the base station's 101 transmit power. If not, the network processing element 110 iteratively reduces the base station's 101 transmit power while maintaining downlink communications with the UE 102 as long as it is within the base station's 101 reception range. The network processing element 110 does this for each of the UE's 102 so as to ensure that all of the UEs 102 can be accommodated with the updated transmit power.

Even if the data rate required by a farthest UE 102 (i.e., distance with respect to the base station 101) is such that a higher modulation order than QPSK is needed, the base station 101 can allocate more time/frequency resources to the UE 102 and still operate at QPSK modulation. One way to achieve this is for the base station 101 to target and minimize the transmit power required for the UE 102 with the highest required transmit power, and then iteratively repeat the process until the physical layer (PHY) resource utilization is maximized.

In this regard, the network processing element 110 calculates the PHY resources to support the UEs 102 in the LTE frame, in the process element 253. From there, the network processing element 110 locates the UE 102 receiving the least amount of power, in the process element 254. The network processing element 110 then determines whether any remaining PHY layer resources exist, in the process element 255. An LTE PHY layer resource is a Physical Resource Block (PRB), which is basically a 2D resource comprised of a number of subcarriers over a certain number of symbol periods. If a PHY layer resource exists, the network processing element 110 changes the downlink transmit power of the base station 101, in the process element 256, and directs the UEs 102 in the base station's 101 range to also reduce their transmit powers, in the process element 257. Thereafter, the network processing element 110 calculates new MCSs and PHY resources for all of the UEs 102 in the LTE frame, in the process element 258. This process is repeated until the minimum transmit power for sustaining downlink communications from the base station 101 to the UEs 102 is attained. If no other PHY resources exist, the network processing element directs the base station 101 to maintain the current downlink transmit power, in the process element 259, and then transmits the LTE frame for transmission as scheduled, in the process on the 260.

The process 280 of FIG. 5 illustrates an alternative to reducing the downlink transmit power of the base station 101. In this embodiment, the process 280 focuses on the UE 102 with the lowest received power. This allows the network processing element 110 to establish a minimum bound on the transmit power of a particular base station 101. Like the process 250 in FIG. 4, the process 280 also initiates by estimating the locations of the UEs 102, in the process element 281, and by sorting the scheduled UEs 102 based on their received power for any given transmit power of the base station 101, in the process element 282. Then, the network processing element 110 arranges the UEs 102 in the range of the base station 101 according to descending receive power levels by denoting them as, for example, UE-1, UE-2, . . . , UE-N (wherein "N" is merely intended to represent an integer greater than 1 and not necessarily equal to any other N reference designated herein). Based on this, the network processing element 101 can determine the lowest transmit power for successful transmission of downlink communications to the UEs 102 in the range of the base station 101, in the process element 283.

The network processing element 110 then determines the time/frequency resources needed for the UEs 102, in the process element 284. In this regard, the network processing element 110 may determine the MCSs needed for the UEs 102 and denote those MCSs of the UEs 102 as MCS-0, MCS-1 . . . MCS-I, with MCS-0 being the least amount of power for a UE 102 to achieve proper demodulation of a signal. For example, using the balance of resources, the network processing element 110 determines if there is a resource allocation scheme to accommodate the data rate requirements of other UEs 102 in the range of the base station 101. If no such scheme exists, the network processing element 110 gradually increases the power level such that the data rate requirements of all UEs 102 are met with the minimum transmit power of the base station 101. If no time/frequency resources remain for the UEs 102, then the network processing element 110 increments to the next MCS, in the process element 286, and returns to the process element 283 to determine the lowest base station power for successful transmission to the UEs 102. Otherwise, the network processing element determines the highest transmit power that can be supported by the UEs 102, in the process element 287.

Once the highest transmit power has been determined, the network processing element determines whether time/frequency resources can be reallocated, in the process element 288. If they cannot be reallocated, the network processing element 110 increments to the next MCS, in the process element 290, and returns to the process element 283 to determine the lowest base station power for successful transmission to the UEs 102. Otherwise, the network processing element determines that the transmit power for downlink communications to the UEs 102 has been established (e.g., lowered to the desired amount), in the process element 289, and begins to transmit to the UEs 102 in the range of the base station 101.

It should be noted that once the downlink transmit power has been established, in the process element 289, that downlink transmit power is not maintained interminably. Rather, the network processing element 110 may continually monitor the UEs 102 of any particular base station 101 and adjust downlink transmit power as desired. For example, UEs are often mobile devices that move in and out of the range of base stations. Accordingly, the lowest transmit power operable for successful transmission to the UEs may change based on a UE 102 leaving the range of the base station 101. The network processing element 110 is operable to adjust for such frequent changes of the UEs 102.

Figure 6:
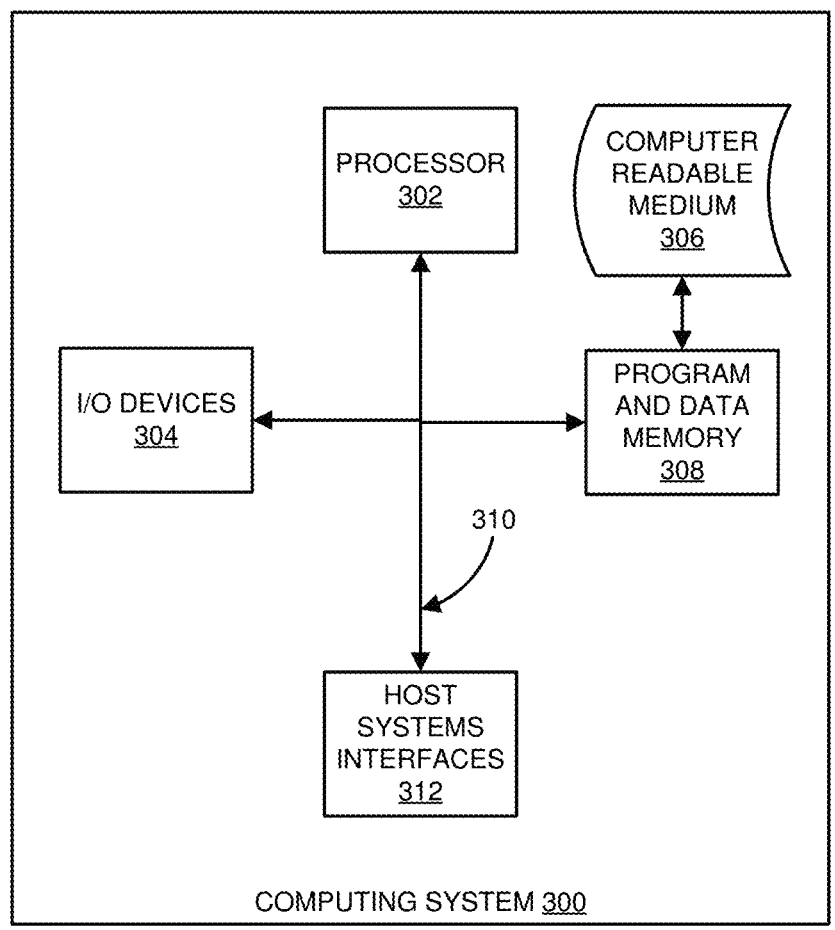
FIG. 6 is a block diagram of an exemplary computing system in which a computer readable medium provides instructions for performing methods herein.

The invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 6 illustrates a computing system 300 in which a computer readable medium 306 may provide instructions for performing any of the methods disclosed herein.

Furthermore, the invention can take the form of a computer program product accessible from the computer readable medium 306 providing program code for use by or in connection with a computer or any instruction execution system. For the purposes of this description, the computer readable medium 306 can be any apparatus that can tangibly store the program for use by or in connection with the instruction execution system, apparatus, or device, including the computer system 300.

The medium 306 can be any tangible electronic, magnetic, optical, electromagnetic, infrared, or semiconductor system (or apparatus or device). Examples of a computer readable medium 306 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 300, suitable for storing and/or executing program code, can include one or more processors 302 coupled directly or indirectly to memory 308 through a system bus 310. The memory 308 can include local memory employed during actual execution of the program code, bulk storage, and cache memories which provide temporary storage of at least some program code in order to reduce the number of times code is retrieved from bulk storage during execution. Input/output or I/O devices 304 (including but not limited to keyboards, displays, pointing devices, etc.) can be coupled to the system either directly or through intervening I/O controllers. Network adapters may also be coupled to the system to enable the computing system 300 to become coupled to other data processing systems, such as through host systems interfaces 312, or remote printers or storage devices through intervening private or public networks. Modems, cable modem and Ethernet cards are just a few of the currently available types of network adapters.

What is claimed is:

1. A wireless communication system capable of operating in a Radio Frequency (RF) band with a conflicting additional wireless communication system, the wireless communication system comprising:
   a wireless base station operable to transmit downlink communications to a user equipment (UE) in the RF band and to receive uplink communications from the UE in the RF band; and
   a processor that is separate from the UE, the processor being operable to:
   detect the uplink communications from the UE,
   determine a location of the UE within an antenna directional radiation pattern of the wireless base station based at least partially on the detected uplink communications, and
   downgrade the downlink communications from the wireless base station to the UE by changing the antenna directional radiation pattern according to the location of the UE within the antenna directional radiation pattern, to avoid interference with the conflicting additional wireless communication system.

2. The wireless communication system of claim 1, wherein the processor is further operable to:
   determine minimal signal energy required by the UE to meet its downlink data needs; and
   reduce transmit power level of the wireless base station according to the minimal signal energy required by the UE to meet its downlink data needs, to avoid interference with the conflicting additional wireless communication system.

3. The wireless communication system of claim 2, wherein the processor is further operable to allocate additional time and/or frequency resources to the UE, to enable the wireless communication system to meet the downlink data needs of the UE after reducing transmit power level of the wireless base station.

4. The wireless communication system of claim 1, wherein the processor is further operable to:
   determine a minimum required Modulation and Coding Scheme (MCS) of the downlink communications for the UE to meet its downlink data needs; and
   change the MCS according to the minimum required MCS of the downlink communications for the UE to meet its downlink data needs, to avoid interference with the conflicting additional wireless communication system.

5. The first wireless communication system of claim 4, wherein the processor is further operable to allocate additional time and/or frequency resources to the UE, to enable the wireless communication system to meet the downlink data needs of the UE at the minimum required MCS of the downlink communications for the UE.

6. A method operable with a wireless communication system operating in a Radio Frequency (RF) band with a conflicting additional wireless communication system, the method comprising:
   receiving uplink communications from a user equipment (UE) in the RF band via a wireless base station;
   estimating a location of the UE within an antenna directional radiation pattern of the wireless base station, at least partially based on the uplink communications; and
   downgrading downlink communications from the wireless base station to the UE by changing the antenna directional radiation pattern according to the location of the UE within the antenna directional radiation pattern, to avoid interference with the conflicting additional wireless communication system.

7. The method of claim 6, further comprising:
   determining minimal signal energy required by the UE to meet its downlink data needs; and
   reducing transmit power level of the wireless base station according to the minimal signal energy required by the UE to meet its downlink data needs, to avoid interference with the conflicting additional wireless communication system.

8. The method of claim 7, further comprising allocating additional time and/or frequency resources to the UE, to enable the wireless communication system to meet the downlink data needs of the UE after reducing transmit power level of the wireless base station.

9. The method of claim 6, further comprising:
   determining a minimum required Modulation and Coding Scheme (MCS) of the downlink communications for the UE to meet its downlink data needs; and
   changing the MCS according to the minimum required MCS of the downlink communications for the UE to meet its downlink data needs, to avoid interference with the conflicting additional wireless communication system.

10. The method of claim 9, further comprising allocating additional time and/or frequency resources to the UE, to enable the wireless communication system to meet the downlink data needs of the UE at the minimum required MCS of the downlink communications for the UE.

11. A wireless communication system capable of operating in a Radio Frequency (RF) band with a conflicting additional wireless communication system, the wireless communication system comprising:
    a wireless base station operable to:
    transmit downlink communications in the RF band to a plurality of user equipment (UE) instances, and
    receive uplink communications in the RF band from the plurality of UE instances; and
    a processor that is separate from the UE, the processor being operable to:
    detect respective uplink communications from each of the plurality of UE instances,
    estimate a respective location of each of the plurality of UE instances based on the detected uplink communications, and
    reduce transmit power level of the wireless base station according to minimal signal energy required by the plurality of UE instances to meet their respective downlink data needs, to avoid interference with the conflicting additional wireless communication system.

12. The wireless communication system of claim 11, wherein the processor is further operable to determine a first one of the plurality of UE instances which is receiving downlink communications from the wireless base station at a lowest power level of all of the plurality of UE instances and increase time and/or frequency resources allocated to the first one of the plurality of UE instances, to enable the first one of the plurality of UE instances to meet its respective downlink data needs at a reduced transmit power level of the wireless base station.

13. The wireless communication system of claim 11, wherein the processor is further operable to determine a first one of the plurality of UE instances which is receiving downlink communications from the wireless base station at a lowest power level of all of the plurality of UE instances and determine a lowest transmit power level of the wireless base station such that each of the plurality of UE instances meets its respective downlink data needs.

14. The wireless communication system of claim 11, wherein the processor is further operable to direct each of the plurality of UE instances to reduce transmit power level of its respective uplink communication to the wireless base station.

15. The wireless communication system of claim 11, wherein the processor is further operable to increase a Modulation and Coding Scheme (MCS) of the downlink communications from the wireless base station for a first UE instance of the plurality of UE instances, to enable the first UE instance to meet its downlink data needs.

16. A method operable with a wireless communication system operating in a Radio Frequency (RF) band with a conflicting additional wireless communication system, the method comprising:
   receiving uplink communications from a plurality user equipment (UE) instances in the RF band via a wireless base station;
   estimating a respective location of each of the plurality of UE instances based on respective detected uplink communications of the plurality of UE instances; and
   reducing transmit power level of the wireless base station according to minimal signal energy required by the plurality of UE instances to meet their respective downlink data needs, to avoid interference with the conflicting additional wireless communication system.

17. The method of claim 16, further comprising:
   determining a first one of the plurality of UE instances which is receiving downlink communications from the wireless base station at a lowest power level of all of the plurality of UE instances; and
   increasing time and/or frequency resources allocated to the first one of the plurality of UE instances, to enable the first one of the plurality of UE instances to meet its respective downlink data needs at a reduced transmit power level of the wireless base station.

18. The method of claim 16, further comprising:
   determining a first one of the plurality of UE instances which is receiving downlink communications from the wireless base station at a lowest power level of all of the plurality of UE instances; and
   determining a lowest transmit power level of the wireless base station such that each of the plurality of UE instances meets its respective downlink data needs.

19. The method of claim 16, further comprising directing each of the plurality of UE instances to reduce transmit power level of its respective uplink communication to the wireless base station.

20. The method of claim 16, further comprising increasing a Modulation and Coding Scheme (MCS) of the downlink communications from the wireless base station for a first UE instance of the plurality of UE instances, to enable the first UE instance to meet its downlink data needs.

* * * * *